US008235094B2

(12) United States Patent
Wayman et al.

(10) Patent No.: US 8,235,094 B2
(45) Date of Patent: Aug. 7, 2012

(54) APPARATUS FOR TRANSFERRING HEAT IN A FIN OF A HEAT SINK

(75) Inventors: Michael J. Wayman, Waconia, MN (US); Michael J. Nelson, Prior Lake, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 1027 days.

(21) Appl. No.: 11/831,561

(22) Filed: Jul. 31, 2007

(65) Prior Publication Data

US 2009/0032234 A1 Feb. 5, 2009

(51) Int. Cl.
F28F 7/00 (2006.01)
H05K 7/20 (2006.01)

(52) U.S. Cl. ...................... 165/80.3; 165/185

(58) Field of Classification Search .............. 165/80.3, 165/185; 361/697, 703, 704, 709, 710; 257/706, 257/720–722; 174/16.3
See application file for complete search history.

(56) References Cited

U.S. PATENT DOCUMENTS

| 3,163,207 | A | * | 12/1964 | Schultz | 165/68 |
|---|---|---|---|---|---|
| 3,220,471 | A | * | 11/1965 | Coe | 165/121 |
| 3,312,277 | A | | 4/1967 | Chitouras | |
| 3,359,461 | A | | 12/1967 | Schuler et al. | |
| 3,566,959 | A | * | 3/1971 | Koltuniak et al. | 165/80.3 |
| 4,369,838 | A | * | 1/1983 | Asanuma et al. | 165/185 |
| 5,134,545 | A | | 7/1992 | Smith | |
| 5,494,753 | A | | 2/1996 | Anthony | |
| 5,504,653 | A | | 4/1996 | Murphy et al. | |
| 5,863,467 | A | | 1/1999 | Mariner et al. | |
| 5,958,572 | A | | 9/1999 | Schmidt et al. | |
| 5,969,949 | A | | 10/1999 | Kim et al. | |
| 6,046,498 | A | | 4/2000 | Yoshikawa | |
| 6,097,598 | A | | 8/2000 | Miyahara | |
| 6,104,090 | A | | 8/2000 | Unger et al. | |
| 6,131,651 | A | | 10/2000 | Richy, III | |
| 6,257,328 | B1 | | 7/2001 | Fujiwara et al. | |
| 6,407,922 | B1 | | 6/2002 | Eckblad et al. | |
| 6,469,381 | B1 | | 10/2002 | Houle et al. | |
| 6,585,925 | B2 | | 7/2003 | Benefield | |
| 6,661,317 | B2 | | 12/2003 | Ali et al. | |
| 6,680,015 | B2 | | 1/2004 | McCullough | |
| 6,691,768 | B2 | | 2/2004 | Hsieh et al. | |
| 6,758,263 | B2 | | 7/2004 | Krassowski et al. | |
| 6,771,502 | B2 | | 8/2004 | Getz, Jr. et al. | |
| 6,779,593 | B1 | * | 8/2004 | Hegde | 165/80.3 |

(Continued)

OTHER PUBLICATIONS

DTI Global Watch Mission Report, "Developments and Trends in Thermal Management Technologies—a Mission to the USA", Feb. 2007, Publisher: Pera on behalf of Department of Trade and Industry.

(Continued)

*Primary Examiner* — Tho V Duong
(74) *Attorney, Agent, or Firm* — Fogg & Powers LLC

(57) ABSTRACT

An apparatus for dissipating heat through a plurality of fins is provided. The apparatus includes a heat dissipating member composed of metal and having a plurality of fins projecting from a first side of the heat dissipating member. Additionally, the apparatus includes a thermal material within at least one fin of the plurality of fins, the thermal material having a thermal conductivity greater than the thermal conductivity of the at least one fin in a direction normal to the first side of the heat dissipating member. Finally, a thermal spreader thermally coupled to the heat dissipating member, the thermal spreader configured to spread heat across the plurality of fins of the heat dissipating member is included.

13 Claims, 4 Drawing Sheets

U.S. PATENT DOCUMENTS

| | | |
|---|---|---|
| 6,859,367 B2 | 2/2005 | Davison |
| 6,896,045 B2 | 5/2005 | Panek |
| 6,898,084 B2 | 5/2005 | Misra |
| 6,918,438 B2 * | 7/2005 | Ellsworth et al. ............ 165/185 |
| 6,977,814 B2 | 12/2005 | Hornung |
| 6,982,874 B2 | 1/2006 | Smale et al. |
| 7,053,295 B2 | 5/2006 | Murasawa |
| 7,086,451 B2 | 8/2006 | Leu |
| 7,108,055 B2 | 9/2006 | Krassowski et al. |
| 7,176,564 B2 | 2/2007 | Kim |
| 7,195,951 B2 | 3/2007 | Houle et al. |
| 7,202,309 B2 | 4/2007 | Furrer et al. |
| 7,219,721 B2 | 5/2007 | Miyazaki et al. |
| 7,220,485 B2 | 5/2007 | Sayir et al. |
| 7,221,860 B2 | 5/2007 | Fujimura et al. |
| 7,307,844 B2 | 12/2007 | Wu |
| 7,328,508 B2 | 2/2008 | Edwards et al. |
| 7,349,214 B2 | 3/2008 | Jeong |
| 7,431,072 B2 | 10/2008 | Miyazaki et al. |
| 7,446,412 B2 * | 11/2008 | Gwin ........................... 257/722 |
| 7,539,019 B2 | 5/2009 | Wayman et al. |
| 2002/0172009 A1 | 11/2002 | Ikushima et al. |
| 2002/0179287 A1 | 12/2002 | Graf |
| 2003/0116312 A1 | 6/2003 | Krassowski |
| 2004/0134646 A1 | 7/2004 | Chu |
| 2004/0177947 A1 | 9/2004 | Krassowski et al. |
| 2004/0223303 A1 | 11/2004 | Hornung |
| 2005/0006054 A1 | 1/2005 | Miyazaki |
| 2005/0167085 A1 * | 8/2005 | Chu et al. .................... 165/80.3 |
| 2006/0063018 A1 * | 3/2006 | Krassowski et al. .......... 428/545 |
| 2006/0086493 A1 | 4/2006 | Fujiwara et al. |
| 2007/0053168 A1 | 3/2007 | Sayir et al. |
| 2007/0062676 A1 | 3/2007 | Yao |
| 2007/0086196 A1 | 4/2007 | Wong |
| 2007/0107872 A1 | 5/2007 | Mayazaki et al. |
| 2007/0108595 A1 | 5/2007 | Refai-Ahmed |
| 2007/0257359 A1 | 11/2007 | Reis et al. |
| 2009/0032217 A1 | 2/2009 | Wayman |
| 2009/0032218 A1 | 2/2009 | Wayman |
| 2009/0032234 A1 | 2/2009 | Wayman et al. |
| 2009/0141452 A1 | 6/2009 | Wayman |

OTHER PUBLICATIONS

Motesano, Mark J., "Annealed Pyrolytic Graphite", Jun. 2006, Publisher: Advanced Materials & Processes.

"TC1050 Thermal Management Materials", GE Advanced Ceramics, Sep. 2003, pp. 1-2, Publisher: General Electric Company.

"TPG Thermal Management Material", GE Advanced Ceramics, Sep. 2003, pp. 1-2, Publisher: General Electric Company.

* cited by examiner

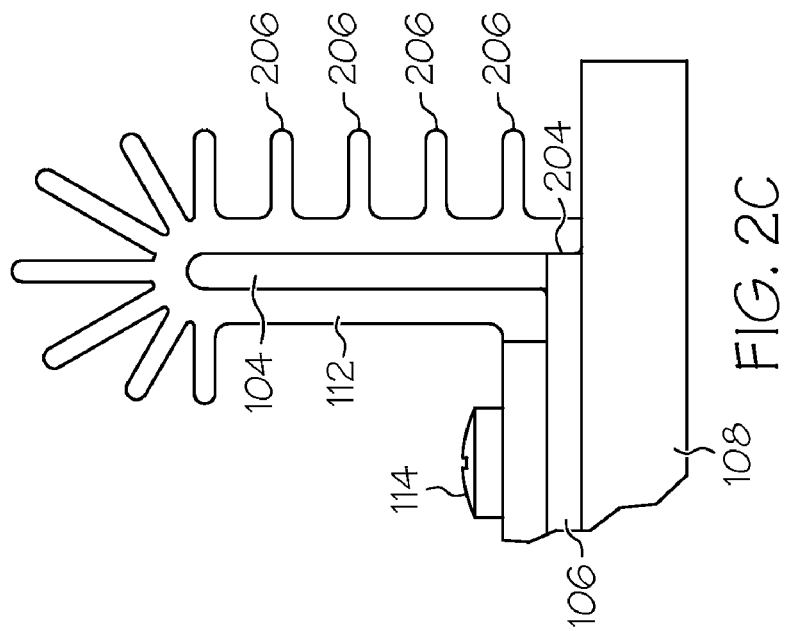
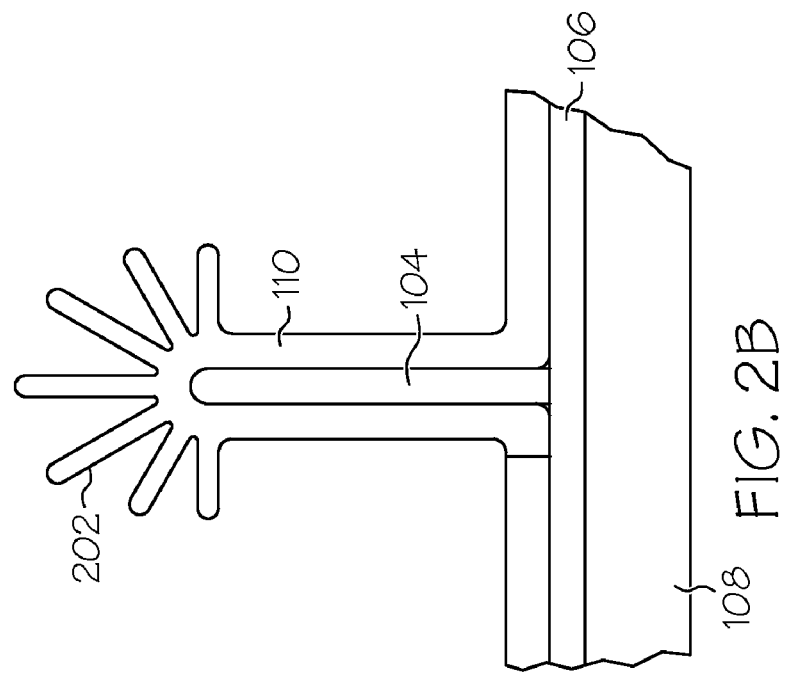

APPARATUS FOR TRANSFERRING HEAT IN A FIN OF A HEAT SINK

BACKGROUND

For many devices removing heat is essential in order to keep the device operating effectively. Often, to aid in removal of heat, a heat sink is coupled to the device. The heat sink is generally a metal component with a flat base on one side and a number of fins on the other. The flat base is coupled to the device and the fins extend out from the base. The fins increase the surface area available for heat dissipation to the surrounding environment. Often, however, heat from the electronic device does not propagate evenly from the heat generating device to all areas of the heat sink. This results in localized "hot spots" near where the heat is coupled into the heat sink. Because the heat does not adequately spread from the hot spot, some areas on the heat sink may be dissipating heat only minimally. Thus, the heat sink is not cooling up to its potential, because the heat is being dissipated from only a portion of the surface area on the heat sink.

One area in which it is difficult for heat to propagate through is in the fins of the heat sink. The difficulty occurs because heat concentrates in one area along the fin. This results in the fin not dissipating heat at its potential, because the heat is not adequately spread along the fin. Another problem arises because heat concentrates at the base of the fin. Thus, the full surface area of the fin is not utilized to its potential because heat has difficulty not reach the tip of the fin. Further, even if the heat does reach the tip of the fin, the speed of propagation of the heat through the fin may be slower than needed or desired to adequately dissipate heat.

The heat dissipation problems are increased when using heat sinks with electronic devices, because many electronic devices generate a large amount of heat in a relatively small area. For the reasons stated above, and for other reasons stated below which will become apparent to those skilled in the art upon reading and understanding the present specification, there is a need in the art for an apparatus and method for improving the heat dissipation of a fin.

SUMMARY

An apparatus for dissipating heat through a plurality of fins is provided. The apparatus includes a heat dissipating member composed of metal and having a plurality of fins projecting from a first side of the heat dissipating member. Additionally, the apparatus includes a thermal material within at least one fin of the plurality of fins, the thermal material having a thermal conductivity greater than the thermal conductivity of the at least one fin in a direction normal to the first side of the heat dissipating member. Finally, a thermal spreader thermally coupled to the heat dissipating member, the thermal spreader configured to spread heat across the plurality of fins of the heat dissipating member is included.

BRIEF DESCRIPTION OF THE DRAWINGS

The present invention can be more easily understood, and further advantages and uses thereof are more readily apparent, when considered in view of the detailed description and the following figures in which:

FIG. 2B is a cross-sectional view of one embodiment of a fin of the heat sink of FIG. 2A;

FIG. 2C is a cross-sectional view of one embodiment of a fin of the heat sink of FIG. 2A;

In accordance with common practice, the various described features are not drawn to scale but are drawn to emphasize specific features relevant to the present invention.

DETAILED DESCRIPTION

In the following detailed description, reference is made to the accompanying drawings that form a part hereof, and in which is shown by way of illustration specific illustrative embodiments in which the method and system may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Embodiments of the present invention provide for an apparatus that effectively dissipates heat through at least one fine. Some embodiments of the apparatus include a strip of thermal material disposed within a fin of a heat dissipating member. The strip of thermal material aids in propagation of heat toward the tip of the fin. In addition, some embodiments of the apparatus include a plurality of secondary fins projecting from the (main) fin. The secondary fins further increase the surface area of the fin.

Figure 1:
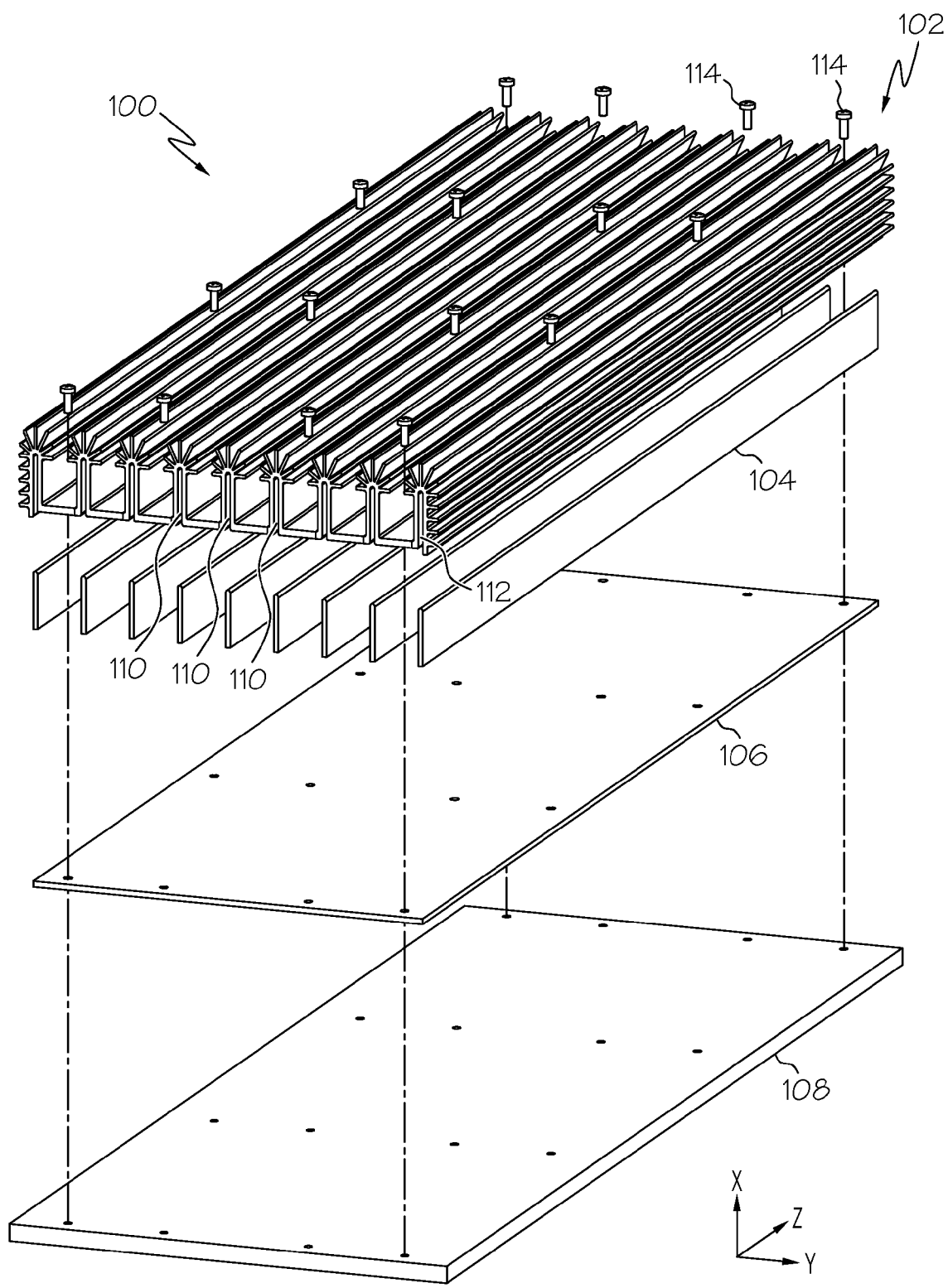
FIG. 1 is an exploded view of one embodiment of a heat sink that efficiently dissipates heat through a plurality of fins.

FIG. 1 is an exploded view of one embodiment of a heat sink 100 having efficient heat propagation through a plurality of fins. Heat sink 100 includes a finned section 102, a plurality of thermal cores 104, a thermal spreader 106, and a base 108. Heat sink 100 dissipates heat to the surrounding environment through a plurality of primary fins 110, 112 on finned section 102. In one embodiment, heat generating devices are mounted on base 108 and are thermally coupled to base 108. Heat from heat generating devices propagates through base 108, thermal spreader 106, thermal core 104, and into finned section 102 for dissipation to the surrounding environment.

Each of the plurality of primary fins 110, 112 projects out normal to the surface of heat sink 100, extending along one side of finned section 102. In the embodiment shown in FIG. 1, the plurality of primary fins 110, 112 is composed of two fin types: a central fin 110 and an edge fin 112. Each primary fin 110, 112 is a ridge having a plurality of secondary fins. In the embodiment shown, primary fins 110, 112 are oriented parallel to each other. More detail regarding central fins, edge fins, and secondary fins is provided with respect to FIGS. 2A, 2B, and 2C.

In one embodiment, each primary fin 110, 112 has a crevice within for housing a thermal core 104. Each thermal core 104 is a strip of thermal material having a thermal conductivity higher than that of finned section 102. Thermal cores 104 extend along the length (z-direction) of primary fins 110, 112 and height (x-direction) primary fins 110, 112. Thus each thermal core 104 aids in distributing heat along each primary fin 110, 112 and toward the tip of each primary fin 110, 112, because heat propagates more easily through thermal cores 104 than through primary fins 110, 112. In this embodiment, thermal cores 104 have a high thermal conductivity in the z-direction and the x-direction as shown in FIG. 1. Thus, thermal cores 104 easily propagate heat along the length (z-direction) of each fin and also propagate heat from the base toward the tip (x-direction) of each fin 110, 112.

In one embodiment, finned section 102 is composed of aluminum. In an alternative embodiment, finned section 102 is composed of steel. In other embodiments, finned section 102 is composed of other conductive materials or a combination of conductive materials. Although as shown in FIG. 1, primary fins 110, 112 are oriented parallel to each other, other orientations can also be used. For example, in an alternative embodiment, fins 110, 112 are oriented in an asterisk shape such that one end of each fin is near the center of finned surface 102 and fins 110, 112 extend outward in different directions from the center. In other embodiments, fins 110, 112 are oriented in a parallel diagonal manner or in other patterns as known to those skilled in the art. In still other embodiment, fins 110 are obelisk type structures, or other shapes as known to those skilled in the art.

Thermal spreader 106 of heat sink 100 aids in spreading heat across the heat sink 100. In one embodiment, thermal spreader 106 is a sheet of thermal material having thermal conductivity greater than the thermal conductivity of finned section 102. Thermal spreader 106 is positioned between finned section 102 and base 108. In one embodiment, base 108 is a sheet of aluminum and a plurality of fasteners 114 are used to secure base 108 to finned section 102. In one embodiment, fasteners 114 are screws. In alternative embodiments, fasteners 114 are rivets, clamps, or other structures as known to those skilled in the art.

In other embodiments, base 108 is composed of other conductive metals, for example, steel. Base 108 and finned section 102 enclose both thermal spreader 106 and thermal cores 104. Thermal spreader 106 is thermally coupled to base 106 and finned section 102 to spread heat from base 106 across finned section 102. In one embodiment, thermal spreader 106 is also coupled to thermal cores 104. In this embodiment, heat from thermal spreader 106 can propagate directly into thermal cores 104 and up into primary fins 110, 112. In one embodiment, thermal spreader 106 has a plurality of vias (not shown) for aiding in heat transfer between base 108 and thermal spreader 106 and also aiding in heat transfer between finned section 102 and thermal spreader 106.

In one embodiment a plurality of heat generating devices (not shown) are mounted and thermally coupled to base 108. Heat from the devices is coupled to base 108 and propagates through base and into thermal spreader 106. Once the heat is in thermal spreader 106, the heat rapidly propagates through spreader 106 and across heat sink 100. From thermal spreader 106, heat is transferred to finned section 102 and thermal cores 104. In one embodiment, the plurality of vias aid in heat transfer from thermal spreader 106 to finned section 102 and thermal cores 104. Some heat from thermal spreader 106 is propagated directly into finned section 102 and propagates up primary fins 110, 112. Additionally, some of the heat propagates into thermal cores 104. Once the heat reaches thermal cores 104, the heat propagates through thermal cores 104 along the length of primary fins 110, 112 and also propagates toward the tip of primary fins 110, 112. Here, the heat propagates into secondary fins and is dissipated to the surrounding environment.

Although thermal spreader 106 is illustrated as a sheet of thermal material 106, other layouts of thermal spreader 106 can also be used. For example, in an alternative embodiment, thermal spreader 106 is a plurality of strips of thermal material which are oriented perpendicular to primary fins 110, 112. In other embodiments, other designs of heat spreader 106 can be used.

In one embodiment, thermal spreader 106 is a material having a high thermal conductivity in the z-y plane. Similarly, in one embodiment, thermal core 104 is a material having a high thermal conductivity in a direction parallel to the extension of the primary fins 110, 112 (e.g. the z-direction). Additionally, thermal core 104 has a high thermal conductivity in a direction of projection of primary fins 110, 112 (e.g. the x-direction). For example, in one embodiment, thermal core 104 and thermal spreader 106 are thermal pyrolytic graphite (TPG). TPG is commercially available from Momentive Performance Materials in Wilton, Conn. TPG may be referred to as highly oriented pyrolytic graphite (HOPG), or compression annealed pyrolytic graphite (CAPG), and refers to graphite materials consisting of crystallites of considerable size, the crystallites being highly aligned or oriented with respect to each other and having well ordered carbon layers or a high degree of preferred crystallite orientation, with an in-plane thermal conductivity greater than 1000 W/m-K. In one embodiment, TPG has an in-plane thermal conductivity of approximately 1,500 W/m-K. Here, TPG is oriented in each primary fin 110, 112 such that the in-plane of the TPG is aligned with the x-z plane in FIG. 1. Thus, the TPG efficiently propagates heat along the length of main fins 110, 112 (z direction) and also propagates heat out towards the tip of main fins 110, 112 (x direction). Likewise, TPG is oriented for thermal spreader 106, such that the in-plane conductivity aligns with the z-y plane.

In one embodiment, TPG is formed as described in U.S. Pat. No. 5,863,467 which is hereby incorporated herein by reference. Briefly, to manufacture heat sink 100 with TPG, pyrolytic graphite is deposited between base 106 and heat dissipating member 102, and heat sink 100 is heat treated to form the pyrolytic graphite into a crystal structure. The resulting crystal structure, TPG, has a high in plane conductivity.

In an alternative embodiment, thermal cores 104 and/or thermal spreader 106 are diamond-like-carbon (DLC) or a diamond material having a high in-plane thermal conductivity. In other embodiments, thermal cores 104 and/or thermal spreader 106 are copper or other material having a thermal conductivity higher than finned section 102 and base 108.

Figure 2A:
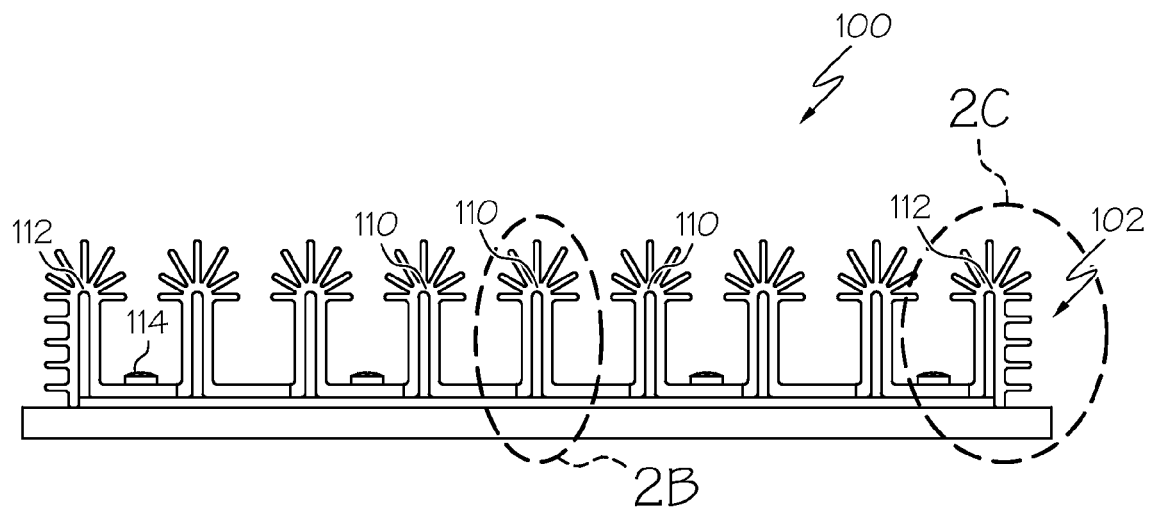
FIG. 2A is a cross-sectional view of one embodiment of the heat sink of FIG. 1.

Referring now to FIGS. 2A, 2B, and 2C, cross-sectional views of one embodiment of heat sink 100 are illustrated. In one embodiment, primary fins 110, 112 of finned section 102 have a plurality of secondary fins 202 positioned at the tip of primary fins 110, 112. In this embodiment, secondary fins 202 are oriented in a semi-circular splayed array to receive a large air flow. In one embodiment, as shown in FIG. 2A, the length of some secondary fins 202 is limited by clearance required for fasteners 114. Accordingly, secondary fins 202 located on primary fins 110, 112 which are adjacent to a fastener 114, should allow sufficient space for fastener 114 and tool required to secure fastener 114. Advantageously, the location of secondary fins 202 is coordinated with thermal core 104 to increase heat dissipation. Heat propagates from the end of thermal core 104 near the base of primary fins 110, 112 to the end of thermal core 104 which is proximate the tip of primary fins 110, 112. Thus, heat reaching the tip of primary fins 110, 112 is easily propagated to secondary fins 202. Additionally, when an in-plane conductor such as TPG is used, very little heat is released along the sides of primary fins 110, 112. Instead nearly all of the heat entering thermal cores 104 is propagated to the tip, thus, most heat is concentrated at the tip and is further spread into secondary fins 202.

As mentioned above, primary fins 110, 112 consist of central fins 110 and edge fins 112. Central fins 110 are located near the middle portion of finned section 102 and edge fins 112 are located near the edge of finned section 112. As shown in FIG. 1, central fins 110 have secondary fins 202 on their tips, but no secondary fins on the sides of central fins 110. This is because this embodiment of central fins 110 is designed for an in-plane conductor and little heat is present at the edges of central fins 110.

Edge fin 112 shown in FIG. 2C, however, takes advantage of not having an adjacent fin on one side by including a plurality of secondary fins 206 on the side of the edge fin 112. Additionally, thermal spreader 116 does propagate heat into edge fins 112 which are on the edges of heat sink 100. Thermal spreader 116 is in contact with edge fin 112 at an edge 204 of thermal spreader 116. At this edge 204, heat from thermal spreader 116 transfers into edge fin 112. This heat then propagates up the side of edge fin 112, into secondary fins 206, and dissipates into the environment. As shown, secondary fins 206 project perpendicular to edge fin 112. In other embodiments, secondary fins 206 are oriented at different angles with respect to edge fin 112.

Advantageously, the design of heat sink 100 is economical to manufacture. For example, as shown in FIG. 1, base 108 and finned section 102 are formed by an extrusion process. Main fins 110, 112, secondary fins 202, and edge fins 204 each are elongated parallel to each other, thus allowing finned section 102 to be formed through extrusion. As shown in FIG. 1, in finned section 102, only apertures for use with fasteners 114 require machining after the extrusion process. Additionally, since finned section 102 is formed by extrusion, heat sink 100 can easily be manufactured at different sized for different applications. This is because the length of finned section 102 can simply be cut at any length according to the needed or desired application.

In an alternative embodiment, primary fins 110, 112 have no secondary fins 202, 206. Thus, the majority of heat is dissipated directly from primary fins 110, 112 to the surrounding environment. In other embodiments, primary fins have some, but not all of secondary fins 202, 206.

FIG. 3A is an exploded view and FIG. 3B is a cross-sectional view of one embodiment of a heat sink 300 having efficient heat propagation throughout its fins. Heat sink 300 is an alternative design to heat sink 100. FIGS. 3A and 3B illustrates a portion of a finned section of heat sink 300. Although, heat sink 300 is shown without a thermal spreader and a base, it should be understood that a base and/or a thermal spreader can be used with heat sink 300 as needed or desired for a particular application. Heat sink 300 is composed of a plurality of fin components 302. Each fin component 302 is a generally "u" shaped structure and forms one side of two adjacent main fins. Each fin component 302 interlocks with an adjacent fin component 302. A main fin is formed at the junction of the two components 302. A thermal core 304 is housed between the two components 302, and thus is located in the center of the main fin.

Figure 3:
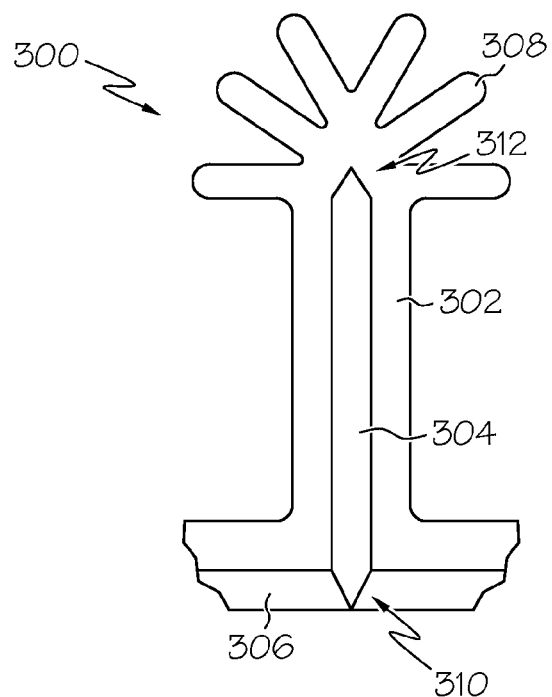
FIG. 3 is a cross-sectional view of one embodiment of a heat sink the efficiently dissipates heat through a fin.

Referring now to FIG. 3, one embodiment of a heat sink 300 having a primary fin 302 with a thermal core 304 is illustrated. Heat sink 300 also has a heat spreader 306, and primary fin 302 also has a plurality of secondary fins 308. FIG. 3 illustrates one embodiment of coupling interface 310 between thermal core 304 and heat spreader 306. In this embodiment, thermal core 304 has two beveled edges which meet to form a point in coupling interface 310. Heat spreader 306 has a complementarily beveled edge to match thermal core 304. Advantageously, the beveled end of thermal core 304 allows heat to transfer efficiently between thermal core 304 and heat spreader 306. This is especially true, when in-plane conductors, such as TPG, are used for either or both of thermal core 304 and heat spreader 306. This is because the beveled edges generate direct contact from the plane of conduction of the heat spreader 306 to the plane of conduction of the thermal core 304.

FIG. 3 also illustrates one embodiment of coupling interface 312 between thermal core 304 and primary fin 302. Here again thermal core 304 has two beveled edges which come together in a point. The beveled shape of coupling interface 312 allow for heat to be released at different points along the height of primary fin 304. The greater the angle of the bevel, the more area the heat will be released into.

Although coupling interface 310 and coupling interface 312 are designed for use with in-plane conductors as thermal core 304 and heat spreader 306, interfaces 310 and 312 can be used with other types of thermal materials, for example, copper, as one or both of thermal core 304 or heat spreader 306. Further although FIG. 3 illustrates two beveled edges for coupling interface 310 and coupling interface 312, either or both interfaces 310, 312, can have a single beveled edge, be rounded as interface 312 is shown in FIGS. 2A, 2B, and 2C, or be planar as interface 310 is shown in FIGS. 2A, 2B, and 2C.

Figure 4A:
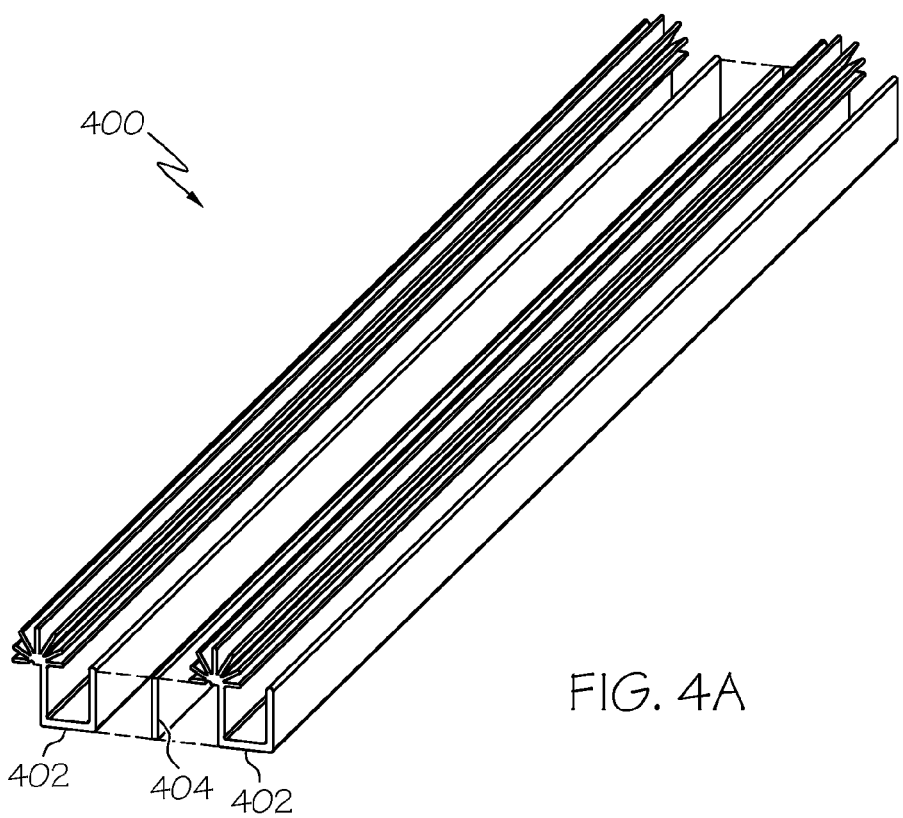
FIG. 4A is an exploded view of one embodiment of the manufacturing components of the heat sink of FIG. 1.
Figure 4B:
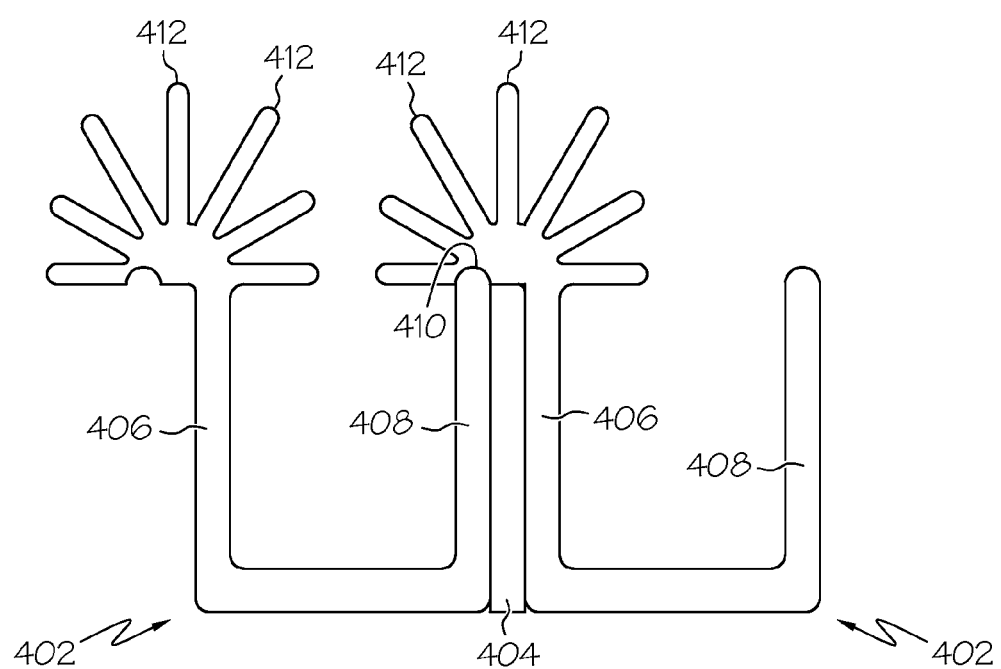
FIG. 4B is a cross-sectional view of one embodiment of the manufacturing components of the heat sink of FIG. 1.

Referring now to FIGS. 4A and 4B, one embodiment of a heat sink 400 is illustrated showing components of a finned section. Heat sink 400 includes two fin components 402 and a thermal core 404. Fin components 402 are identically manufactured structures and are designed to be placed adjacent one another to form a primary fin. As shown in FIG. 4B, each fin component 402 has a generally 'u' shaped cross-section. Each side of the 'u' forms an arm of the fin component. Thus, in FIG. 4B, each fin component has a left arm 406 and a right arm 408. Adjacent arms of fin components 402 are joined to form a primary fin. A strip of thermal core 404 is placed between the adjacent arms 406, 408 of the fin components 402. Thus, an easily manufacture primary fin having a thermal core is disclosed.

In one embodiment, thermal core 404 is TPG and is formed as described in U.S. Pat. No. 5,863,467 which is hereby incorporated herein by reference. Briefly, to manufacture heat sink 400 with TPG, pyrolytic graphite is deposited between left arm 406 and right arm 408 of adjacent fin components 402, and heat sink 400 is heat treated to form the pyrolytic graphite into a crystal structure. The resulting crystal structure, TPG, has a high in plane conductivity.

To secure a right arm 408 to a left arm 406, and interlocking feature 410 is included. Interlocking feature 410 is made up of two complementary shapes, one shape on each arm 406, 408. In this embodiment, feature 408 is a groove on left arm 406 and the rounded portion on right arm 408. In other embodiments, feature 408 is a different shape, and or in a different location as is known to those skilled in the art.

In this embodiment, left arm 406 of fin components 402 includes an array of secondary fins 412. In alternative embodiments, fin components 408 have a portion of the array of secondary fins 412 on each of their arms 406, 408. Thus, each portion of the array of secondary fins 412 mates with a portion of an array of secondary fins of an adjacent fin component 402 to form a complete array of secondary fins 412. Alternatively, secondary fins 412 could be entirely on the right arm 408 of fin component 402. Additionally, in other embodiments, fin components 402 have different secondary fin layouts including but not limited to edge fins, all vertical secondary fins, and others.

In one embodiment, heat sink 400 also includes an end fin component having a slightly different design than fin component 402. End fin component, for example, may not include any secondary fins 412, so as to form a clean edge of heat sink 400. Here, the middle portion of heat sink 400 is composed of fin components 402 and one or both edges of heat sink 400 have an end component.

Advantageously, constructing heat sink 400 of a plurality of fin components 402 allows the width of heat sink 400 to be selected at a needed or desired width. This is possible by placing the appropriate number of fin components 402 within heat sink 402. Also, each fin component 402 as shown in FIGS. 4A and 4B can be manufactured through an extrusion process. Thus, in addition to selectable width, heat sink 400 also has a selectable length by changing the length of the extrusion.

Although specific embodiments have been illustrated and described herein, it will be appreciated by those of ordinary skill in the art that any arrangement, which is calculated to achieve the same purpose, may be substituted for the specific embodiment shown. This application is intended to base any adaptations or variations of the present invention. Therefore, it is manifestly intended that this invention be limited only by the claims and the equivalents thereof.

What is claimed is:

1. An apparatus for dissipating heat through a plurality of fins, the apparatus comprising:
   a heat dissipating member composed of metal and having a plurality of parallel fins projecting from a first side of the heat dissipating member;
   a thermal material within at least one fin of the plurality of fins, the thermal material having a thermal conductivity greater than the thermal conductivity of the at least one fin in a direction normal to the first side of the heat dissipating member;
   a thermal spreader thermally coupled to the heat dissipating member, the thermal spreader configured as a planar sheet in direct, thermal contact with the thermal material in the at least one fin to spread heat across the plurality of parallel fins of the heat dissipating member;
   wherein the thermal material is thermal pyrolytic graphite (TPG); and
   wherein the thermal spreader is composed of TPG.

2. The apparatus of claim 1, wherein the thermal material within the plurality of fins is substantially planar.

3. The apparatus of claim 1, wherein the thermal spreader is thermally coupled to the thermal material within the at least one fin.

4. The apparatus of claim 1, further comprising a plurality of secondary fins, extending from the at least one fin.

5. The apparatus of claim 1, wherein the heat dissipation member further comprises:
   a first component forming a first side of the at least one fin and a second component forming a second side of the at least one fin, wherein the thermal material is disposed between the first side of the at least one fin and the second side of the at least one fin.

6. The apparatus of claim 4, wherein the plurality of secondary fins extend from a tip of the at least one fin.

7. The apparatus of claim 6, wherein the plurality of secondary fins are splayed about the tip of the at least one fin.

8. The apparatus of claim 4, wherein the plurality of secondary fins extend from a side of the at least one fin.

9. The apparatus of claim 5, further comprising:
   the thermal spreader thermally coupled to each strip of thermal material.

10. An apparatus for improving the heat dissipation from a fin, the apparatus comprising:
    a heat dissipating member composed of metal and having a plurality of parallel fins projecting from a first side of the heat dissipating member;
    the heat dissipating member comprising:
      a first fin component composed of metal and having a generally 'u' shaped cross-section forming a first arm and a second arm;
      a second fin component composed of metal and having a generally 'u' shaped cross-section forming a third arm and a forth arm; and
      a strip of thermal material having a thermal conductivity greater than the thermal conductivity of the first and second fin components;
      wherein the second arm of the first fin component is configured to be joined with the third arm of the second fin component, and the strip of thermal material is configured to be placed between the second arm and the third arm;
    a thermal spreader thermally coupled to the heat dissipating member, the thermal spreader configured as a planar sheet in direct, thermal contact with the strip of thermal material to spread heat across the plurality of parallel fins of the heat dissipating member;
    wherein the thermal material is thermal pyrolytic graphite (TPG); and
    wherein the thermal spreader is composed of TPG.

11. The apparatus of claim 10, further comprising:
    a third fin component composed of metal and having a generally 'u' shaped cross-section forming a fifth arm and a sixth arm; and
    a second strip of thermal material having a thermal conductivity greater than the thermal conductivity of the third fin component;
    wherein the fourth arm of the second fin component is configured to be joined with the fifth arm of the third fin component, and the strip of thermal material is configured to be placed between the fourth arm and the fifth arm.

12. The apparatus of claim 10, wherein the second arm of the first fin component has an interlocking feature, and wherein the third arm of the second fin component has a complementary interlocking feature.

13. The apparatus of claim 10, wherein the second arm of the first fin component has at least one secondary fin.

* * * * *